(12) United States Patent
Yonetsu et al.

(10) Patent No.: US 12,115,603 B2
(45) Date of Patent: Oct. 15, 2024

(54) BONDED BODY, CERAMIC COPPER CIRCUIT SUBSTRATE, AND SEMICONDUCTOR DEVICE

(71) Applicants: KABUSHIKI KAISHA TOSHIBA, Tokyo (JP); TOSHIBA MATERIALS CO., LTD., Yokohama (JP)

(72) Inventors: Maki Yonetsu, Mitaka (JP); Seiichi Suenaga, Yokohama (JP); Sachiko Fujisawa, Kawasaki (JP); Takashi Sano, Fujisawa (JP)

(73) Assignees: KABUSHIKI KAISHA TOSHIBA, Tokyo (JP); TOSHIBA MATERIALS CO., LTD., Yokohama (JP)

( * ) Notice: Subject to any disclaimer, the term of this patent is extended or adjusted under 35 U.S.C. 154(b) by 55 days.

(21) Appl. No.: 18/054,208

(22) Filed: Nov. 10, 2022

(65) Prior Publication Data
US 2023/0080016 A1    Mar. 16, 2023

Related U.S. Application Data

(63) Continuation of application No. PCT/JP2021/018591, filed on May 17, 2021.

(30) Foreign Application Priority Data

May 20, 2020  (JP) ................................. 2020-087824
Jul. 27, 2020  (JP) ................................. 2020-126587

(51) Int. Cl.
*B23K 35/30* (2006.01)
*H05K 1/03* (2006.01)
(Continued)

(52) U.S. Cl.
CPC ........ *B23K 35/3006* (2013.01); *B23K 35/302* (2013.01); *H05K 1/0306* (2013.01);
(Continued)

(58) Field of Classification Search
CPC .................................................. B23K 35/302
See application file for complete search history.

(56) References Cited

U.S. PATENT DOCUMENTS

| | | |
|---|---|---|
| 5,807,626 A | 9/1998 | Naba |
| 2019/0150298 A1 | 5/2019 | Kishimoto |
| 2020/0128664 A1 | 4/2020 | Harada et al. |

FOREIGN PATENT DOCUMENTS

| | | |
|---|---|---|
| CN | 109315061 A | 2/2019 |
| EP | 3 492 441 A1 | 6/2019 |

(Continued)

OTHER PUBLICATIONS

International Search Report issued Jul. 20, 2021 in PCT/JP2021/018591, filed on May 17, 2021, 2 pages.

*Primary Examiner* — Ian A Rummel
(74) *Attorney, Agent, or Firm* — Oblon, McClelland, Maier & Neustadt, L.L.P.

(57) ABSTRACT

A bonded body according to an embodiment includes a ceramic substrate, a copper plate, and a bonding layer that is located on at least one surface of the ceramic substrate and bonds the ceramic substrate and the copper plate. The bonding layer includes titanium. The bonding layer includes first and second regions; the first region includes a layer including titanium as a major component; the layer is formed at an interface of the bonding layer with the ceramic substrate; and the second region is positioned between the first region and the copper plate. The bonded body has a ratio M1/M2 of a titanium concentration M1 at % in the first region and a titanium concentration M2 at % in the second region that is not less than 0.1 and not more than 5 when the Ti concentrations are measured by EDX respectively in measurement regions in the first and second regions.

17 Claims, 2 Drawing Sheets

(51) Int. Cl.
*B23K 1/00* (2006.01)
*B23K 101/40* (2006.01)
*B23K 103/00* (2006.01)
*H01L 23/15* (2006.01)
*H05K 1/09* (2006.01)

(52) U.S. Cl.
CPC ........ *B23K 1/0016* (2013.01); *B23K 2101/40* (2018.08); *B23K 2103/56* (2018.08); *H01L 23/15* (2013.01); *H05K 1/09* (2013.01); *H05K 2201/0338* (2013.01)

(56) References Cited

FOREIGN PATENT DOCUMENTS

| | | |
|---|---|---|
| JP | 2004-314161 A | 11/2004 |
| JP | 2005-112677 A | 4/2005 |
| JP | 4077888 B2 | 4/2008 |
| JP | 2013-211546 A | 10/2013 |
| WO | WO 2017/213207 A1 | 12/2017 |
| WO | WO 2018/021472 A1 | 2/2018 |
| WO | WO 2018/199060 A1 | 11/2018 |

BONDED BODY, CERAMIC COPPER CIRCUIT SUBSTRATE, AND SEMICONDUCTOR DEVICE

CROSS-REFERENCE TO RELATED APPLICATIONS

This is a continuation application of International Patent Application PCT/JP2021/018591, filed on May 17, 2021. This application also claims priority to Japanese Patent Application No. 2020-087824, filed on May 20, 2020 and Japanese Patent Application No. 2020-126587, filed on Jul. 27, 2020. The entire contents of which are incorporated herein by reference.

FIELD

Embodiments described herein relate generally to a bonded body, a ceramic copper circuit substrate, and a semiconductor device.

BACKGROUND

A bonded body of a ceramic substrate and a copper plate is used as a circuit board for mounting a semiconductor element or the like. WO 2018/021472 (Patent Document 1) discusses a ceramic copper circuit substrate in which a ceramic substrate and a copper plate are bonded. In Patent Document 1, a bonding layer includes a brazing material including Ag, Cu, Ti, etc. Also, temperature cycle test (TCT) characteristics are improved by controlling the nanoindentation hardness of the bonding layer. In Patent Document 1, the nanoindentation hardness is controlled by causing a AgTi crystal or TiC to exist in the bonding layer. In Patent Document 1, the bonding strength and the TCT characteristics are improved by controlling the nanoindentation hardness.

On the other hand, in some cases, the TCT characteristics degrade as the bonded body is made larger.

DETAILED DESCRIPTION

A bonded body according to an embodiment includes a ceramic substrate, a copper plate, and a bonding layer that is located on at least one surface of the ceramic substrate and bonds the ceramic substrate and the copper plate. The bonding layer includes titanium. The bonding layer includes a first region and a second region; the first region includes a layer including titanium as a major component; the layer is formed at an interface of the bonding layer with the ceramic substrate; and the second region is positioned between the first region and the copper plate. The bonded body has a ratio M1/M2 of a titanium concentration M1 at % in the first region and a titanium concentration M2 at % in the second region that is not less than 0.1 and not more than 5 when the Ti concentrations are measured by EDX respectively in measurement regions in the first and second regions, each of the measurement regions having an area of 200 μm×thickness.

Figure 1:
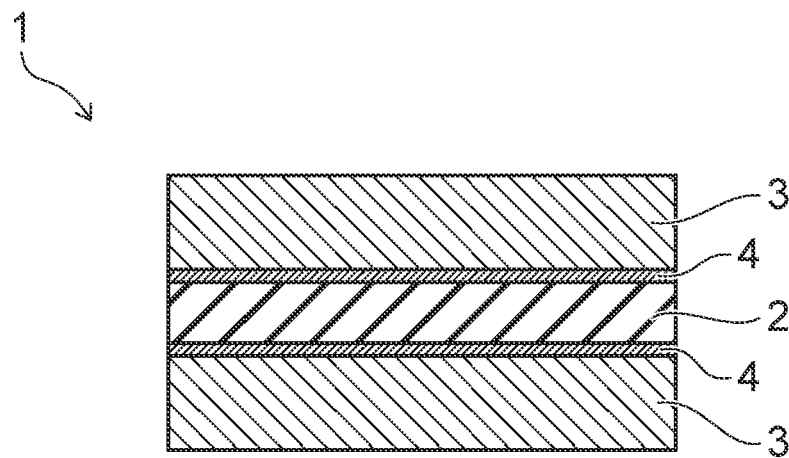
FIG. 1 shows an example of a bonded body according to an embodiment.
Figure 2:
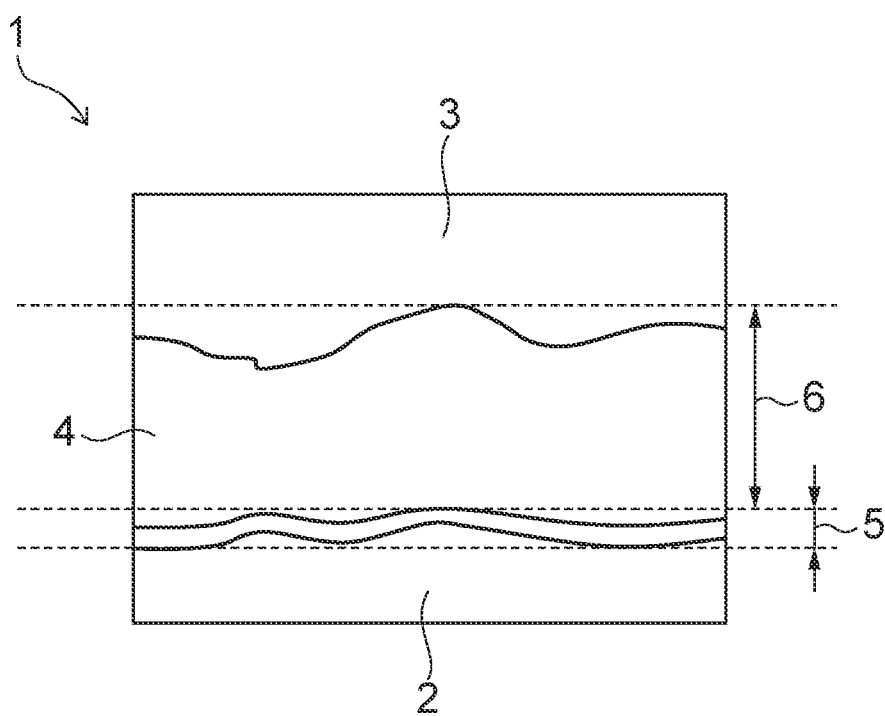
FIG. 2 shows an example of a bonding layer of the bonded body according to the embodiment.

FIG. 1 shows an example of a bonded body according to an embodiment. FIG. 2 shows an example of a bonding layer of the bonded body according to the embodiment. In FIGS. 1 and 2, 1 is a bonded body. 2 is a ceramic substrate. 3 is a copper plate. 4 is a bonding layer. 5 is a first region. 6 is a second region.

FIG. 1 shows the bonded body 1 in which two copper plates 3 are located at two surfaces of the ceramic substrate 2 with the bonding layers 4 respectively interposed. In the illustrated example, the longitudinal and lateral sizes are respectively equal between the ceramic substrate 2 and the two copper plates 3. The bonded body according to the embodiment is not limited to such a configuration, and may have a structure in which a copper plate is located at only one surface of the ceramic substrate 2. Also, the longitudinal and lateral sizes of the ceramic substrate 2 may be different from the longitudinal and lateral sizes of the copper plate 3.

The bonded body 1 includes the ceramic substrate 2, the copper plate 3, and the bonding layer 4. The bonding layer 4 is located on at least one surface of the ceramic substrate and bonds the ceramic substrate 2 and the copper plate 3. Also, the bonding layer 4 includes Ti and includes the first region 5 and the second region 6. The first region 5 includes a layer that includes titanium as a major component. The layer that includes titanium as a major component is formed at the interface of the bonding layer 4 with the ceramic substrate 2. The second region 6 is positioned between the first region 5 and the copper plate.

FIG. 2 is a conceptual view of the bonding layer 4. The bonding layer 4 has a stacked structure of the first and second regions 5 and 6.

The first region 5 is a region that includes a layer including titanium as a major component. The layer that includes titanium as a major component refers to a region in which not less than 30 at % of titanium exists. Also, the layer that includes titanium as a major component refers to a layer in which one, two, or more of titanium alone, an oxide, a nitride, a silicide, or an oxynitride exists. For example, when titanium silicide is formed on a titanium nitride layer and contacts the titanium nitride layer, the layer that includes titanium as a major component is the titanium silicide and the titanium nitride layer. That is, when the titanium silicide directly contacts the titanium nitride layer, the titanium nitride layer and the titanium silicide are counted as the layer including titanium as a major component.

Also, the first region 5 exists along the interface between the ceramic substrate 2 and the bonding layer 4. Therefore, the layer that includes titanium as a major component is formed along the ceramic substrate 2 surface.

The layer that includes titanium as a major component is continuously formed in the thickness direction from the ceramic substrate 2. For example, titanium nitride that exists at a position separated from the layer including titanium as a major component is counted as the second region 6. When titanium alone, an oxide, or an oxynitride exists at a position separated from the layer including titanium as a major component, the titanium alone, the oxide, or the oxynitride is counted as the second region 6.

$TiO_2$ (titanium oxide) or the like is an example of Ti oxide. TiN (titanium nitride), $Ti_2N$ (dititanium nitride), etc., are examples of Ti nitride. TiON (titanium oxynitride) or the like is an example of Ti oxynitride. Ti oxide, Ti nitride, and Ti oxynitride are not limited to such examples. For example, TiN (titanium nitride) has stable stoichiometry at a titanium-to-nitrogen atomic ratio of 1:1, but may deviate from stoichiometry. Also, the layer that includes titanium as a major component may be a layer in which two or more of the illustrated materials are mixed. "Titanium nitride" indicates a compound of titanium and nitrogen. The notation of TiN is not limited to a titanium-to-nitrogen atomic ratio of 1:1 and indicates a compound of titanium and nitrogen.

Also, when the ceramic substrate is a nitride ceramic substrate, the layer that includes titanium as a major component includes titanium nitride as a major component. Also, in the case of a nitride ceramic substrate, titanium nitride that includes not less than 30 at % of titanium is included in the layer including titanium as a major component. Also, one, two, or more selected from cubic, hexagonal, and tetragonal may exist in the titanium nitride. Also, in the case of a nitride ceramic substrate, the titanium nitride layer that is formed at the surface of the ceramic substrate 2 can be used as a reference to determine the first region 5. That is, the titanium amount M1 of the first region 5 can be determined using the maximum thickness of the titanium nitride layer.

When the bonding layer 4 includes Ag, one, two, or more selected from $Ti_2N$, $Ti_{0.83}N_{0.17}$, and metallic Ti may exist in the layer including titanium nitride as a major component. $Ti_2N$, $Ti_{0.83}N_{0.17}$, or metallic Ti is a Ti-rich phase with a high Ti amount. The Ti amount in the second region 6 can be controlled by a Ti-rich phase existing in the layer including titanium nitride as a major component. Also, when the bonding layer does not include Ag, it is favorable for the Ti-rich phase to exist within the range of not less than 0 at % and not more than 10 at % in the layer including titanium nitride as a major component. A Ti-rich phase of 0 at % refers to being below the detection limit. A Ti-rich phase includes more Ti than a region having a Ti-to-N atomic ratio of 1:1. The ratio of the titanium concentration of the first region 5 and the titanium concentration of the second region 6 can be controlled by increasing the Ti amount of the first region 5.

Also, when the ceramic substrate is an oxide ceramic, the layer that includes titanium as a major component includes titanium oxide as a major component. Also, $TiO_2$, $TiO$, $Ti_3O_2$, etc., are examples of titanium oxide. Therefore, the layer that includes titanium as a major component may be confirmed using the titanium oxide layer as a reference.

The layer that includes titanium as a major component is formed on the surface of the ceramic substrate 2. It is unnecessary for the layer including titanium as a major component to have a constant thickness in the surface direction. Also, it is sufficient for the layer that includes titanium as a major component to exist in not less than 90% of the interface of the bonding layer 4 with the ceramic substrate 2. The interface of the ceramic substrate 2 is the region of the surface of the ceramic substrate 2 at which the bonding layer 4 is located. The region of the surface of the ceramic substrate 2 at which the bonding layer 4 is not located is not counted.

The layer that includes titanium as a major component can be confirmed by EDX (energy dispersive X-ray) analysis. EDX analysis of any cross section of the bonded body 1 is performed. In the EDX analysis, area analysis within a measurement region of the bonding layer 4 is performed. The measurement region is an area of 200 μm long× thickness. A layer that includes titanium as a major component can be considered to exist if the layer that includes titanium as a major component is observed at the surface of the ceramic substrate 2 over not less than 180 μm (=200 μm×90%) within the measurement region.

Also, components other than Ti included in the layer including titanium as a major component can be analyzed by area analysis by EDX analysis. For example, the layer that includes titanium as a major component is considered to include Ti nitride if nitrogen is detected by the area analysis. Also, TEM (transmission electron microscopy) analysis is used when it is difficult to discriminate the boundary between the ceramic substrate 2 and the bonding layer 4. EDX point analysis of the bonding layer 4 based on the TEM analysis result is an effective method of detecting Ti and N. Elements other than nitrogen also can be detected by a similar technique.

The thickness of the first region 5 is determined to be the width between the most proximal location and the most distant location of the layer including titanium as a major component to the ceramic substrate 2 within the measurement region. The layer that includes titanium as a major component is formed along the surface of the ceramic substrate 2. A micro unevenness exists in the surface of the ceramic substrate 2. Therefore, the thickness of the first region 5 is determined by the method described above. Because the thickness of the first region 5 is determined by this method, the first region 5 also includes regions other than the layer including titanium as a major component.

Also, a line that passes through the most proximal location parallel to the surface direction within the measurement region is taken as a boundary line of the ceramic substrate 2 and the first region 5. The surface direction is a direction perpendicular to the thickness direction connecting the ceramic substrate 2 and the bonding layer 4. The boundary line of the ceramic substrate 2 and the first region 5 is called a first boundary line.

A line that is parallel to the surface direction and passes through the most distant location within the measurement region is taken as a boundary line of the first and second regions 5 and 6. The boundary line of the first and second regions 5 and 6 is called a second boundary line. Accordingly, the thickness of the first region 5 is the width between the first boundary line and the second boundary line.

The thickness of the second region 6 is the width from the second boundary line to the boundary between the bonding layer 4 and the copper plate 3. The boundary between the bonding layer 4 and the copper plate 3 is the most distant location within the measurement region at which the components of the bonding layer are continuous and contact the copper plate 3 (the location most distant to the ceramic substrate 2). The detection amount of the components of the bonding layer abruptly decreases and the components of the bonding layer become discontinuous from the vicinity of the interface of the second region 6 with the copper plate 3 into the copper plate 3. A line that passes parallel to the surface direction through the most distant location within the measurement region at which the components of the bonding layer are continuous and contact the copper plate 3 is called a third boundary line. Accordingly, the thickness of the second region 6 is the width from the second boundary line to the third boundary line. A region exists within the measurement region in which the components included in the bonding layer 4 are continuous to the first region 5. The location at which this region contacts the copper plate 3 is the location at which the components of the bonding layer 4 are continuous and contact the copper plate 3.

For example, a case where the components included in the bonding layer 4 are Ag (silver), Cu (copper), Sn (tin), and Ti (titanium) will be described. The components of the bonding layer 4 being continuous refers to a state in which mixed components of one, two, or more selected from Ag, Cu, Sn, and Ti are continuous from the first region 5 to the copper plate 3. The mixed components refer to a state in which Ag, Cu, Sn, and Ti are mixed as single components or mixed as alloys. Therefore, even components of the bonding layer 4 that diffuse into the copper plate 3 are not counted as the third boundary line when discontinuous. Discontinuous is when the components of the bonding layer are distributed in a discontinuous state. Also, when the Cu of the bonding layer 4 cannot be discriminated from the Cu of the copper plate 3, another component is counted as the third boundary line.

The bonded body according to the embodiment includes the ratio M1/M2 of the Ti concentration M1 at % of the first region 5 and the Ti concentration M2 at % of the second region 6 that is not less than 0.1 and not more than 5 when the Ti concentrations are measured by EDX respectively in measurement regions, each having an area of 200 μm×thickness, in the first and second regions 5 and 6.

The Ti concentration ratio M1/M2 being not less than 0.1 and not more than 5 indicates a distribution in which Ti is relatively high in the second region 6. Bonding technology that uses Ti includes active metal bonding. As shown in Patent Document 1 and Patent Document 2, a titanium nitride (TiN) layer is formed in active metal bonding. The titanium nitride layer corresponds to the layer including titanium as a major component. Conventionally, the Ti concentration in the region corresponding to the second region 6 has been low due to the Ti concentration in the titanium nitride layer. Therefore, conventionally, M1/M2 has been not less than 20. The titanium nitride layer is a hard layer. It was found that the hardness difference between the first region and the second region unfavorably affects the TCT characteristics. Also, the Ti amount in the first region 5 is low when M1/M2 is less than 0.1. When the Ti amount in the first region 5 is low, there is a possibility that the bonding strength may be reduced due to an insufficient amount of titanium nitride. In Patent Document 1 and Patent Document 2, the layer that includes titanium as a major component includes titanium nitride (TiN). This is because the nitride ceramic substrate and the Ti react. Therefore, titanium oxide is formed when an oxide ceramic substrate is used.

In active metal bonding, an active metal brazing material is used in which Ag or Cu is used as a major component, and Ti is included as an active metal. Also, there are cases where Sn (tin) or In (indium) is added to the active metal brazing material. Ti is a relatively hard material in the active metal brazing material. Therefore, the hardness can be more homogenized in the bonding layer by controlling the Ti concentration in the bonding layer. Accordingly, it is favorable for M1/M2 to be not less than 0.1 and not more than 5, and more favorably not less than 0.5 and not more than 4.

SEM-EDX is used for the EDX analysis. JSM-IT100 made by JEOL Ltd. or an apparatus with equivalent performance is used for the SEM. Also, EX-9440IT4L11 made by JEOL Ltd. or an apparatus with equivalent performance is used for the EDX. First, area analysis of a measurement region having an area of 200 μm×thickness is performed by EDX. The measurement region is set to 200 μm×thickness because 200 μm×thickness is an area suited to examining the distribution of the bonding layer components. When less than 200 μm, the measurement region is easily affected by the diffusion state into the copper plate of the material included in the bonding layer. The grain sizes of the copper grains included in the copper plate are about 10 to 1000 μm.

The copper plate grain boundaries become routes through which the material included in the bonding layer diffuses. It is favorable for the measurement region to be 200 μm to suppress the effects on the analysis of easy diffusion locations and of difficult diffusion locations. When the measurement region is greater than 200 μm, the Ti concentration fluctuation cannot be measured. Also, as described below, it is favorable for the measurement region to be 200 μm to measure the Ti concentration fluctuation in the second region. M1/M2 is determined using the average value of any three locations.

It is favorable for the Ti concentration fluctuation in the second region 6 to be within ±20%. The Ti concentration fluctuation in the second region 6 is the difference between the Ti concentration of the second region 6 in a first measurement region and the Ti concentration of the second region 6 in a measurement region other than the first measurement region. The Ti concentration of the first measurement region is used as M2a, and the Ti concentration of the measurement region other than the first measurement region is used as M2b. The Ti concentration fluctuation V in the second region 6 is calculated by V (%)=((M2a−M2b)/M2a)×100.

The TCT characteristics can be improved not only by the Ti concentrations of the first and second regions 5 and 6 but also by suppressing the Ti concentration fluctuation in the second region 6. It is therefore favorable for the Ti concentration fluctuation in the second region 6 to be ±20%, and more favorably within ±10%.

It is favorable for the thickness of the first region to be not more than 5 μm. The first region 5 includes a layer including titanium as a major component. When the first region 5 is thick, i.e., greater than 5 μm, there is a possibility that too much titanium may concentrate in the first region 5; and M1/M2 may exceed 5.

It is favorable for the thickness of the second region to be not less than 5 μm and not more than 70 μm. It is favorable to control the Ti concentration of the second region 6 having a prescribed thickness.

It is favorable for the Ti concentration of the second region to be within the range of not less than 0.5 at % and not more than 15 at %. When the Ti concentration of the second region 6 is less than 0.5 at %, there is a possibility that the Ti amount of the second region 6 may be insufficient. When the Ti amount is low, the Ti concentration fluctuation in the second region 6 easily increases. Also, when the Ti concentration is high, i.e., greater than 15 at %, M1/M2 easily drops below 0.1. It is therefore favorable for the Ti concentration of the second region 6 to be not less than 0.5 at % and not more than 15 at %, and more favorably not less than 1 at % and not more than 10 at %. When measuring the Ti concentration at % of the second region 6, a value excluding O (oxygen), N (nitrogen), and C (carbon) is determined. As described below, metal components such as Ag, Cu, etc., exist in the M2 region. At % is effective to control the existence ratio of the metal components other than Ti.

It is favorable for the thickness of the copper plate to be not less than 0.6 mm. It is favorable for the ceramic substrate to be one selected from a silicon nitride substrate and an aluminum nitride substrate.

The copper plate 3 can include a copper plate or a copper alloy plate. It is favorable for the copper plate 3 to be made of oxygen-free copper. Oxygen-free copper has a copper purity of not less than 99.96 wt % as indicated in JIS-H-3100 (ISO 1337, etc.)

The copper plate 3 is used as a circuit part or a heat dissipation plate. The current-carrying capacity, the heat dissipation, etc., can be improved by increasing the thickness of the copper plate 3. It is therefore favorable for the thickness of the copper plate 3 to be not less than 0.6 mm, and more favorably not less than 0.8 mm.

A silicon nitride substrate, an aluminum nitride substrate, an aluminum oxide substrate, an Alusil substrate, or the like is used as the ceramic substrate 2. It is favorable for the thickness of the ceramic substrate 2 to be not less than 0.1 mm and not more than 1 mm. When the substrate thickness is less than 0.1 mm, there is a risk that the strength may be reduced. Also, when greater than 1 mm, there is a possibility that the ceramic substrate may become a thermal resistor, and the heat dissipation of the bonded body may be degraded.

It is favorable for the three-point bending strength of the silicon nitride substrate to be not less than 600 MPa. It is favorable for the thermal conductivity to be not less than 80 W/m·K. The substrate thickness can be made thin by increasing the strength of the silicon nitride substrate. It is therefore favorable for the three-point bending strength of the silicon nitride substrate to be not less than 600 MPa, and more favorably not less than 700 MPa. Thereby, the thickness of the silicon nitride substrate can be thin, i.e., not more than 0.40 mm, or even not more than 0.30 mm.

The three-point bending strength of the aluminum nitride substrate is about 300 to 450 MPa. On the other hand, the thermal conductivity of the aluminum nitride substrate is not less than 160 W/m·K. Because the strength of the aluminum nitride substrate is low, it is favorable for the substrate thickness to be not less than 0.60 mm.

Although the three-point bending strength of an aluminum oxide substrate is about 300 to 450 MPa, an aluminum oxide substrate is inexpensive. Also, although the three-point bending strength of the Alusil substrate is high, i.e., about 550 MPa, the thermal conductivity is about 30 to 50 W/m·K.

One of a silicon nitride substrate or an aluminum nitride substrate is favorable as the ceramic substrate 2. The silicon nitride substrate and the aluminum nitride substrate are nitride ceramic substrates. A nitride ceramic forms titanium nitride by reacting with an active metal brazing material including Ti. Therefore, a layer that includes titanium nitride as a major component is easily formed in the first region 5.

Also, an oxide ceramic forms titanium oxide by reacting with an active metal brazing material including Ti. Therefore, a layer that includes titanium oxide as a major component is easily formed in the first region 5. The oxide ceramic is an aluminum oxide substrate, an Alusil substrate, etc.

It is favorable for the copper plate 3 to be provided at the two surfaces of the ceramic substrate 2. Warp of the bonded body can be suppressed by bonding copper plates to the two surfaces.

It is favorable for the second region to include one or two selected from silver and copper. Also, it is favorable for the second region to include one or two selected from tin and indium.

To include silver or copper in the second region 6, it is effective to include silver or copper in the active metal brazing material. To include tin or indium in the second region 6, it is effective to include tin or indium in the active metal brazing material.

It is favorable for the active metal brazing material composition to include not less than 0 mass % and not more than 70 mass % of Ag (silver), not less than 15 mass % and not more than 85 mass % of Cu (copper), and not less than 1 mass % and not more than 15 mass % of Ti (titanium) or TiH$_2$ (titanium hydride). Also, when both Ti and TiH$_2$ are used, the total of the two is set within the range of 1 to 15 mass %. Also, when both Ag and Cu are used, it is favorable for Ag to be 20 to 60 mass %, and for Cu to be 15 to 40 mass %.

As necessary, not less than 1 mass % and not more than 50 mass % of one or two selected from Sn (tin) and In (indium) may be included in the active metal brazing material. It is favorable for the content of Ti or TiH$_2$ to be 1 to 15 mass %. As necessary, not less than 0.1 mass % and not more than 2 wt % of C (carbon) may be included in the active metal brazing material.

The ratios of the active metal brazing material composition are calculated using the total of the mixed raw materials as 100 mass %. For example, when the active metal brazing material includes three, i.e., Ag, Cu, and Ti, then Ag+Cu+Ti=100 mass %. When the active metal brazing material includes four, i.e., Ag, Cu, TiH$_2$, and In, then Ag+Cu+TiH$_2$+In=100 mass %. When the active metal brazing material includes five, i.e., Ag, Cu, Ti, Sn, and C, then Ag+Cu+Ti+Sn+C=100 mass %.

Ag or Cu is the base material component of the brazing material. Sn or In has the effect of lowering the melting point of the brazing material. C (carbon) has the effect of controlling the fluidity of the brazing material and controlling the structure of the bonding layer by reacting with other components. Therefore, Ag—Cu—Ti, Ag—Cu—Sn—Ti, Ag—Cu—Ti—C, Ag—Cu—Sn—Ti—C, Ag—Ti, Cu—Ti, Ag—Sn—Ti, Cu—Sn—Ti, Ag—Ti—C, Cu—Ti—C, Ag—Sn—Ti—C, and Cu—Sn—Ti—C are examples of brazing material components. In may be used instead of Sn. Both Sn and In may be used. A low melting-point metal such as Bi (bismuth), Sb (antimony), Ga (gallium), or the like may be used instead of Sn or In.

It is favorable for the melting point of the active metal brazing material to be not more than 700° C. The bonding temperature can be lowered by lowering the melting point of the brazing material. The Ti concentration of the first region 5 and the Ti concentration of the second region 6 can be controlled by lowering the bonding temperature.

It is favorable for the largest endothermic peak of the DSC curve of the active metal brazing material to be within the range of not less than 550° C. and not more than 700° C. The temperature at which the largest endothermic peak of the DSC curve occurs is taken to be the melting point of the active metal brazing material.

The DSC curve is obtained by using a differential scanning calorimeter (DSC) to measure the peaks of endothermic reactions and exothermic reactions. A peak in the negative direction is an endothermic reaction, and a peak in the positive direction is an exothermic reaction.

The DSC curve is measured using a temperature profile made of a heating process, a holding process at a constant temperature, and a cooling process. In the temperature profile, the heating process heats from room temperature to 500° C. at a heating rate of 5° C./min. Then, the heating process is held at 500° C. for 60 minutes. Subsequently, the heating process heats to 845° C. at the heating rate of 5° C./min. In the holding process, 845° C. is held for 30 minutes. The cooling process cools from 845° C. to room temperature at a cooling rate of 5° C./min.

The TGA-DSC simultaneous thermal analyzer STA449-F3-Jupiter made by NETZSCH or an apparatus having equivalent performance is used as the DSC. Also, the measurement is performed in a flow of Ar (argon) by dropping an appropriate amount of the brazing material into an alumina container. It is necessary to prevent the brazing material and the atmosphere from reacting by measuring in an Ar atmosphere.

In the heating process of the DCS curve, the detected temperature of the largest endothermic peak in the temperature range of not less than 550° C. and not more than 800° C. is taken to be the melting point. The melting point of the brazing material being not more than 700° C. means that the largest endothermic peak is within the range of 550 to 700° C. Peaks in the negative direction at less than 550° C., if any, may not be counted as endothermic peaks. An endothermic reaction is caused by the active metal brazing material melting, decomposing, etc. For example, when titanium hydride ($TiH_2$) is used as the active metal, a peak in the negative direction is detected at about 500° C. This peak is the peak when $TiH_2$ decomposes into Ti and H.

Such a bonded body is favorable for the ceramic copper circuit substrate. The copper plate that is located on at least one surface of the ceramic substrate is provided with a circuit structure. A ceramic copper circuit substrate that uses the bonded body according to the embodiment is obtained thereby.

Figure 3:
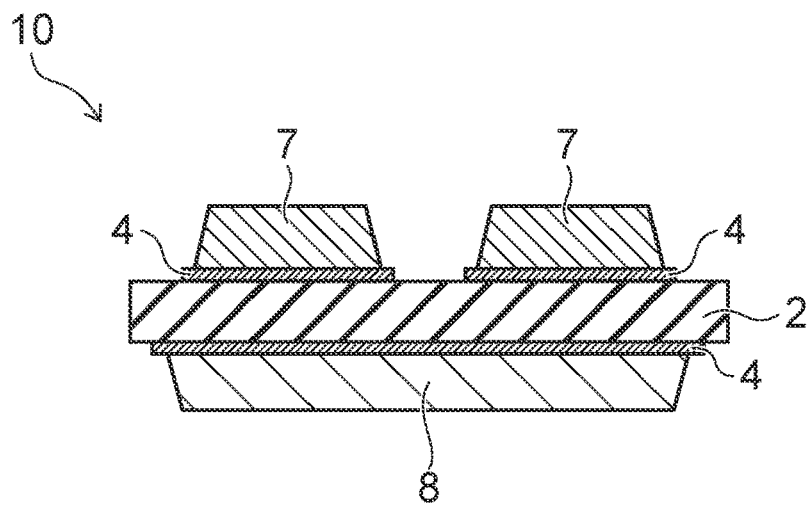
FIG. 3 shows an example of a ceramic copper circuit substrate according to the embodiment.

FIG. 3 shows an example of the ceramic copper circuit substrate according to the embodiment. In FIGS. 3, 7 is a circuit part. 8 is a heat dissipation plate. 10 is a ceramic copper circuit substrate. The circuit part 7 is formed by providing a circuit structure in the copper plate 3 at the front side. Also, the heat dissipation plate 8 is formed by patterning the copper plate 3 at the backside. Two circuit parts 7 are included in FIG. 3. The ceramic copper circuit substrate according to the embodiment is not limited to the illustrated structure. The numbers, shapes, etc., of the circuit parts 7 are arbitrary. Also, the circuit part 7 may be formed by providing circuit structures in the copper plates 3 at two surfaces. The side surface of the circuit part 7 or the side surface of the heat dissipation plate 8 may be oblique to the thickness direction. A bonding layer jutting part may be provided in which the bonding layer 4 juts from the end portion of the circuit part 7 or the end portion of the heat dissipation plate 8. The ceramic copper circuit substrate 10 according to the embodiment can improve the TCT characteristics because the Ti distribution in the bonding layer 4 is controlled.

Figure 4:
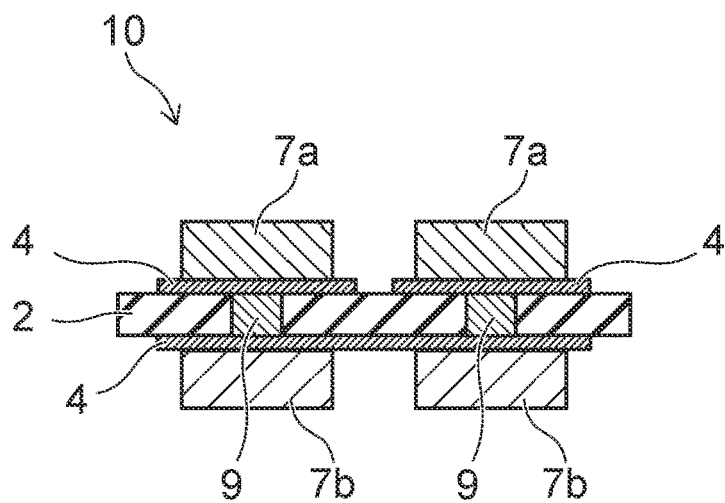
FIG. 4 shows another example of the ceramic copper circuit substrate according to the embodiment.

FIG. 4 shows another example of the ceramic copper circuit substrate according to the embodiment.

A through-hole may be provided in the ceramic substrate. The copper plate on the front side and the copper plate on the backside may be electrically connected via the through-hole. FIG. 4 shows an example of the ceramic copper circuit substrate having through-holes. FIG. 4 is a cross-sectional view at a portion at which the through-holes are provided. In FIG. 4, 10 is a ceramic copper circuit substrate. 2 is a silicon nitride substrate. 4 is a bonding layer. 7a is a circuit part on the front side. 7b is a circuit part on the backside. 9 is a through-hole. In FIG. 4, the circuit part 7a and the circuit part 7b are electrically connected via the through-hole 9. In FIG. 4, multiple through-holes 9 respectively connect multiple circuit parts 7a and multiple circuit parts 7b. The embodiment is not limited to such a structure. The through-hole 9 may be provided in the ceramic copper circuit substrate 10 for only a portion of the multiple circuit parts 7a. The through-hole 9 may be provided for only a portion of the circuit parts 7b. It is favorable for the interior of the through-hole 9 to be filled with the same material as the bonding layer 4. The structure inside the through-hole 9 is not particularly limited as long as the circuit part on the front side and the circuit part on the backside can be electrically connected. Therefore, a metal thin film may be provided on only the through-hole 9 inner wall. On the other hand, the bonding strength can be increased by filling with the same material as the bonding layer 4.

Figure 5:
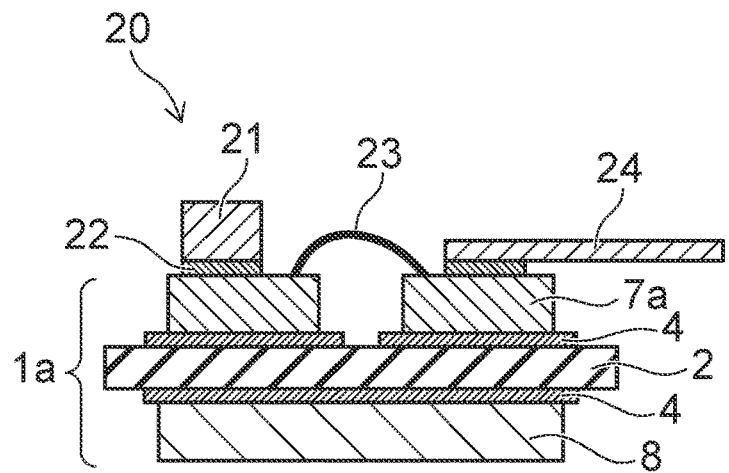
FIG. 5 shows an example of a semiconductor device according to the embodiment.

FIG. 5 shows an example of a semiconductor device according to the embodiment.

The ceramic copper circuit substrate according to the embodiment is favorable in a semiconductor device. In the semiconductor device, a semiconductor element is mounted to the copper plate of the ceramic copper circuit substrate via a bonding layer. FIG. 5 shows an example of the semiconductor device. In FIG. 5, 10 is a ceramic copper circuit substrate. 7 is a circuit part. 8 is a heat dissipation plate. 20 is a semiconductor device. 21 is a semiconductor element. 22 is a bonding layer. 23 is wire bonding. 24 is a metal terminal. In FIG. 5, the semiconductor element 21 is bonded on the circuit part of the ceramic copper circuit substrate 10 via the bonding layer 22. Similarly, the metal terminal 24 is bonded via the bonding layer 22. Adjacent circuit parts are electrically connected to each other by the wire bonding 23. Other than the semiconductor element 21 in FIG. 5, the wire bonding 23 and the metal terminal 24 are bonded to the ceramic copper circuit substrate 10. The semiconductor device according to the embodiment is not limited to such a structure. For example, only one of the wire bonding 23 or the metal terminal 24 may be provided. Pluralities of the semiconductor elements 21, the wire bonding 23, and the metal terminals 24 may be provided on each circuit part on the front side. A circuit structure may be provided in the copper plate on the backside; and the semiconductor element 21, the wire bonding 23, and the metal terminal 24 may be bonded to the copper plate on the backside. Various shapes such as a leadframe shape, a convex shape, etc., are applicable to the metal terminal 24.

The TCT characteristics can be improved by using the bonded body according to the embodiment in the ceramic copper circuit substrate or the semiconductor device described above.

A method for manufacturing the bonded body according to the embodiment will now be described. The method for manufacturing the bonded body according to the embodiment is not limited as long as the bonded body has the configuration described above. Here, an example of a method for obtaining the bonded body according to the embodiment with a high yield is described.

First, the ceramic substrate 2 is prepared. The ceramic substrate 2 is a silicon nitride substrate, an aluminum nitride substrate, an aluminum oxide substrate, an Alusil substrate, etc. The Alusil substrate is a substrate in which aluminum oxide and zirconium oxide are mixed.

The copper plate 3 can include a copper plate or a copper alloy plate. It is favorable for the copper plate 3 to be oxygen-free copper. Oxygen-free copper has a copper purity of not less than 99.96 wt % as indicated in JIS-H-3100.

Then, an active metal brazing material paste that includes Ti is prepared. As a component other than Ti, it is favorable to add one or two selected from Ag and Cu to the active metal brazing material including Ti. Also, it is favorable to add one or two selected from Sn and In to the active metal brazing material. C (carbon) may be added to the active metal brazing material. Also, a compound of $TiH_2$ or the like may be added to the active metal brazing material as Ti. The composition ratios (mass %) of the components are as described above.

To control the melting point of the active metal brazing material, it is effective to control the composition, the grain size of the raw material powder, etc. As described above, Sn or In have the effect of lowering the melting point of the brazing material. It is effective for the powder grain size of Sn or In to be the largest among the components included in the brazing material. For example, when using a Ag—Cu—Sn—Ti brazing material, the grain size of the Sn powder is set to be the largest among the Ag powder, the Cu powder, the Sn powder, and the Ti powder. The Sn powder easily reacts with the other brazing material components. By increasing the grain size of the Sn powder, the Sn powder easily contacts the other components. The melting point of the brazing material can be lowered thereby. The use of In instead of Sn is similar. It is effective to increase the grain size of a component that has the effect of lowering the melting point. Also, lowering the bonding temperature can reduce the load on the bonding equipment.

A uniformly dispersed mixed powder is prepared by mixing the powders of the constituent components of the active metal brazing material. It is favorable to perform the mixing process of the constituent component powders for not less than 10 hours.

Then, an active metal brazing material paste is prepared by mixing the mixed powder with a binder and a solvent. Also, it is favorable to perform the mixing process of the mixed powder, the binder, etc., for not less than 10 hours.

The active metal brazing material paste is coated onto at least one of the ceramic substrate or the copper plate. It is favorable for the thickness of the active metal brazing material paste layer to be not less than 5 µm and not more than 80 µm. The thickness of the active metal brazing material paste layer is the thickness of the coated paste after drying. There is a possibility that the bonding strength may decrease when the thickness is less than 5 µm. Also, when thick, i.e., greater than 80 µm, there is a possibility that the thermal stress in the bonding process may become large, and the warp of the bonded body may become large. It is therefore favorable for the thickness of the active metal brazing material paste layer to be not less than 5 µm and not more than 80 µm, and more favorably not less than 10 µm and not more than 50 µm.

After performing the process of coating the active metal brazing material paste, a process of placing a member not coated with paste on the member coated with the paste is performed. In the case where the active metal brazing material paste is coated onto the ceramic substrate, the copper plate is placed on the ceramic substrate. The active metal brazing material paste may be coated onto two surfaces of the ceramic substrate; and copper plates may be placed respectively on the two surfaces. The active metal brazing material paste may be coated onto the copper plate; and the ceramic substrate may be placed on the copper plate.

Then, a bonding process in which the bonding temperature is not more than 800° C. is performed. The bonding temperature is the maximum temperature maintained for a certain amount of time. A high bonding temperature promotes grain growth of the copper crystal grains included in the copper plate. In conventional active metal bonding, the bonding temperature is about 850° C. The grain growth of the copper plate increases when the bonding temperature is greater than 800° C. When the grain growth of the copper plate is increased, large crystal grains having major diameters greater than 400 µm are easily made.

It is favorable for the bonding temperature to be not more than 800° C., and more favorably not more than 700° C. Although not particularly limited, it is favorable for the lower limit of the bonding temperature to be not less than 500° C. There is a possibility that the reliability of the bond may degrade when the bonding temperature is low. It is therefore favorable for the bonding temperature to be not less than 500° C. and not more than 800° C., and more favorably not less than 550° C. and not more than 700° C. Also, it is favorable for the holding time of the bonding temperature to be not more than 100 minutes, and more favorably not more than 30 minutes.

When bonding at a temperature greater than 800° C., it is favorable for the heating rate to be not less than 20° C./minute. By increasing the heating rate, the heat amount from room temperature to the bonding temperature can be reduced. Thereby, effects equivalent to those of a bonding temperature of not more than 800° C. can be obtained. Also, as an example, the bonding temperature may be greater than 800° C. and not more than 950° C. Although not particularly limited, it is favorable for the upper limit of the heating rate to be not more than 100° C./minute. It is favorable for the heating rate from room temperature to the bonding temperature to be 20 to 100° C./minute, and more favorably 30 to 70° C./minute. There is a possibility that the control may be difficult when the heating rate is greater than 100° C./minute. Also, it is favorable for the cooling rate from the bonding temperature to room temperature to be within the range of 20 to 100° C./minute. By increasing the heating rate and the cooling rate, the heat amount can be equal to the heat amount for not more than 800° C.

Also, it is favorable for the atmosphere of the bonding process to be a vacuum or a nitrogen atmosphere.

It is favorable for the pressure of the vacuum to be not more than $10^{-3}$ Pa. When in a vacuum, the nitriding of the Ti in the brazing material before reacting with the ceramic substrate can be suppressed.

A nitrogen atmosphere refers to an atmosphere including not less than 90 vol % and not more than 100 vol % nitrogen. It is considered that Ti may become titanium nitride before reacting with the ceramic substrate when nitrogen exists in the atmosphere of the bonding process. If the Ti content in the brazing material is not less than 6 mass %, Ti and the ceramic substrate can sufficiently react even in a nitrogen atmosphere.

The bonding process may be either batch or continuous. Batch is a technique in which the ceramic substrate and the copper plate are placed in a storage container to perform the heat treatment. Continuous is a technique in which the ceramic substrate and the copper plate are placed on a belt conveyor and heat treatment is performed while moving. Batch is suited to the bonding process in a vacuum. Continuous is suited to the bonding process in a nitrogen atmosphere. In the case of batch, the holding time of the bonding temperature can be short. In the case of continuous, the holding time of the bonding temperature is long, but the suitability for mass production is improved because the heat treatment can be continuously performed. A batch bonding apparatus is also called a batch furnace; and a continuous bonding apparatus is also called a continuous furnace.

The Ti concentration in the bonding layer 4 can be controlled by lowering the bonding temperature and reducing the holding time of the bonding temperature.

As described above, the constituent components of the active metal brazing material are uniformly mixed. Therefore, the Ti is uniformly dispersed at the active metal brazing material paste layer stage. Also, the layer that includes titanium as a major component is not formed at the active metal brazing material paste layer stage.

The layer that includes titanium as a major component is formed by performing the bonding process. When the bonding temperature is high like a conventional bonding temperature, i.e., 850° C., Ti concentrates in the layer including titanium as a major component. As a result, Ti agglomerates in the first region 5; and M1/M2 becomes about 10.

M1/M2 can be controlled by setting the bonding temperature to be not more than 800° C., or even not less than 550° C. and not more than 700° C. By lowering the bonding temperature, the Ti amount that concentrates in the layer including titanium as a major component can be reduced, and Ti can remain in the second region 6. Similarly, by setting the holding time of the bonding temperature to be not more than 60 minutes, or even not more than 30 minutes, the Ti amount that concentrates in the layer including titanium as a major component can be reduced, and Ti can remain in the second region 6. It is also possible to increase the Ti amount of the second region by increasing the Ti or $TiH_2$ content (e.g., not less than 5 mass %) as a constituent component of the active metal brazing material. As a result, M1/M2 can be within the range of not less than 0.1 and not more than 5.

Also, by uniformly mixing the mixed powder of the active metal brazing material beforehand, the Ti concentration fluctuation in the second region 6 can be within ±20%.

That is, in the case of a batch technique performed in a vacuum, it is effective to lower the bonding temperature to be not more than 800° C., or even not more than 700° C.

In the case of a continuous technique performed in a nitrogen atmosphere, the temperature may be greater than 800° C. The holding time of the bonding temperature can be reduced by increasing the heating rate or the cooling rate. This is because the Ti amount that concentrates in the layer including titanium as a major component can be reduced thereby, and Ti can remain in the second region 6. Also, an active metal brazing material that does not include Ag is effective for a continuous technique in a nitrogen atmosphere.

Also, TiSi, CuSn, and TiSn are formed in the second region 6 of the bonded body on which the bonding process is performed. TiSi is formed by a reaction of titanium and silicon. CuSn is formed by a reaction of copper and tin. TiSn is formed by a reaction of titanium and tin. The atomic ratios of the compounds are not limited to 1:1.

When the bonding process is performed in a vacuum, it is favorable for the mass ratios of the compounds of the second region 6 to satisfy TiSi>TiSn and CuSn>TiSn. CuSn has the lowest melting point among TiSi, CuSn, and TiSn. The bonding process in a vacuum is slow and has a heating rate of about 1 to 2° C./minute. The Ti amount in the second region 6 can be controlled by increasing the formation amount of CuSn in the slow heating process.

In the bonded body, it is favorable for the longitudinal and lateral sizes of the ceramic substrate 2 and the longitudinal and lateral sizes of the copper plate 3 to be respectively equal. It is favorable for the thermal conductivity of the ceramic substrate 2 to be not less than 60 W/m·K. It is favorable for the copper plates 3 to be bonded to the two surfaces of the ceramic substrate 2.

The theoretical value of the thermal conductivity of copper is about 398 W/m·K. By setting the longitudinal and lateral sizes of the ceramic substrate 2 and the longitudinal and lateral sizes of the copper plate 3 to be respectively equal, the heat transfer to the active metal brazing material paste layer is made uniform. Similarly, by increasing the thermal conductivity of the ceramic substrate 2 and by providing the copper plates 3 on two surfaces as well, the heat transfer can be made uniform. Thereby, the Ti concentration fluctuation in the second region 6 can be within ±20%, or even within ±10%. The Ti concentration fluctuation can be suppressed even when the size of the bonded body 1 is increased. Accordingly, the Ti concentration fluctuation can be suppressed even when the bonded body size is large, i.e., not less than 200 mm long but not less than 200 mm wide.

Also, the warp amount of the bonded body can be not more than 0.1 mm even when the longitudinal size or the lateral size of the bonded body is large, i.e., not less than 200 mm. Also, the warp amount of the bonded body can be not more than 0.1 mm even when the thickness of the copper plate on the front side and the thickness of the copper plate on the backside are different.

A bonded body in which a ceramic substrate and a copper plate are bonded can be manufactured by the processes described above. The copper plate 3 is provided with the structure of the circuit part 7 or the heat dissipation plate 8 as necessary. The bonded body 1 is made into the ceramic copper circuit substrate 10 by providing the circuit part 7. The TCT characteristics can be improved because the Ti concentrations of the first and second regions 5 and 6 are controlled. Also, the bonded body is suited to multi-part manufacturing because the size of the bonded body 1 can be increased. Multi-part manufacturing is a method of obtaining small bonded bodies by cutting a large bonded body. There is also a method of subdividing the bonded body or a method of subdividing the ceramic copper circuit substrate. Scribing may be performed to easily perform the subdivision.

EXAMPLES

Examples 1 to 15 and Comparative Examples 1 to 3

The silicon nitride substrate and the aluminum nitride substrate shown in Table 1 were prepared as ceramic substrates.

TABLE 1

| Silicon nitride substrate | Thermal conductivity (W/m · K) | Three-point bending strength (MPa) | Size (Length mm × Width mm × Thickness mm) |
| --- | --- | --- | --- |
| SiN1 | 90 | 700 | 240 × 200 × 0.32 |
| SiN2 | 85 | 650 | 200 × 200 × 0.25 |
| AlN | 180 | 350 | 200 × 200 × 0.635 |

Then, the copper plates shown in Table 2 were prepared. The copper plates each were oxygen-free copper.

TABLE 2

| Copper plate | Plate thickness (mm) |
| --- | --- |
| Copper plate 1 | 0.6 |
| Copper plate 2 | 0.8 |
| Copper plate 3 | 0.3 |

Then, the active metal brazing materials shown in Table 3 were prepared. The grain size of the Sn powder was largest for the active metal brazing materials 1 to 3. The grain size of the Ag powder was largest for the active metal brazing material 4. The mixing time of the constituent components of the brazing materials 1 to 3 and 5 to 6 was not less than 10 hours. The mixing time of the constituent components of the brazing material 4 was 5 hours. The melting point of the brazing material was determined by measuring the DSC curve as shown in the description above.

TABLE 3

| Active metal brazing material | Composition (wt %) | Melting point (° C.) |
|---|---|---|
| Brazing material 1 | Ag(36), Cu(37.7), Sn(18), TiH2(8), C(0.3) | 615 |
| Brazing material 2 | Ag(44.6), Cu(37), Sn(15), TiH2(3), C(0.4) | 572 |
| Brazing material 3 | Ag(38), Cu(37), Sn(20), TiH2(5) | 603 |
| Brazing material 4 | Ag(49), Cu(33), Sn(10), TiH2(8) | 760 |
| Brazing material 5 | Cu(68), Sn(20), TiH2(12) | 586 |
| Brazing material 6 | Cu(63.8), Sn(28), TiH2(8), C(0.2) | 565 |
| Brazing material 7 | Ag(12), Cu(67.7), Sn(12), TiH2(8), C(0.3) | 615 |
| Brazing material 8 | Ag(6), Cu(69.7), Sn(18), TiH2(6), C(0.3) | 618 |

Then, the bonding process that used the ceramic substrate, the copper plate, and the active metal brazing material was performed. The longitudinal and lateral sizes of the copper plate were matched to the longitudinal and lateral sizes of the ceramic substrate. In Table 4, the atmosphere of the bonding process is shown as a vacuum when performed in a vacuum of not more than $10^{-3}$ Pa. Also, the bonding processes that were performed in a nitrogen atmosphere of not less than 98 vol % nitrogen are shown as nitrogen. For the bonding processes that had bonding temperatures of not more than 800° C., the heating rates from room temperature to the bonding temperatures and the cooling rates from the bonding temperatures to room temperature were set to be within the range of 1 to 10° C./minute. Also, for the example 13 and the example 14 in which the bonding temperatures were greater than 800° C., the heating rates from room temperature to the bonding temperatures and the cooling rates from the bonding temperatures to room temperature were set to be within the range of 30 to 70° C./minute. The bonding processes in the vacuum were performed in a batch furnace. Also, the bonding processes in the nitrogen atmosphere were performed in a continuous furnace. The combinations of the raw materials were as shown in Table 4.

TABLE 4

| | | Activemetal brazing material | | Copper plate | | Bonding process | | |
| | | layer | | | | | | |
| | Ceramic substrate | Brazing material | Thickness (μm) | Front side | Back side | Holding temperature (° C.) | Holding time (min) | Atmosphere |
|---|---|---|---|---|---|---|---|---|
| Example 1 | SiN1 | Brazing material 1 | 20 | Copper plate 1 | Copper plate 1 | 680 | 10 | Vacuum |
| Example 2 | SiN2 | Brazing material 1 | 30 | Copper plate 2 | Copper plate 2 | 720 | 20 | Vacuum |
| Example 3 | SiN1 | Brazing material 2 | 40 | Copper plate 1 | Copper plate 1 | 640 | 30 | Vacuum |
| Example 4 | SiN2 | Brazing material 2 | 50 | Copper plate 2 | Copper plate 2 | 650 | 15 | Vacuum |
| Example 5 | SiN1 | Brazing material 3 | 25 | Copper plate 1 | Copper plate 1 | 680 | 20 | Vacuum |
| Example 6 | SiN2 | Brazing material 3 | 35 | Copper plate 2 | Copper plate 2 | 690 | 25 | Vacuum |
| Example 7 | SiN1 | Brazing material 1 | 30 | Copper plate 1 | Copper plate 2 | 660 | 15 | Vacuum |
| Example 8 | SiN2 | Brazing material 2 | 30 | Copper plate 1 | Copper plate 2 | 630 | 15 | Vacuum |
| Example 9 | SiN1 | Brazing material 5 | 20 | Copper plate 2 | Copper plate 2 | 640 | 20 | Vacuum |
| Example 10 | SiN2 | Brazing material 5 | 30 | Copper plate 2 | Copper plate 1 | 650 | 60 | Nitrogen |
| Example 11 | SiN1 | Brazing material 6 | 30 | Copper plate 1 | Copper plate 1 | 640 | 20 | Vacuum |
| Example 12 | SiN2 | Brazing material 6 | 40 | Copper plate 2 | Copper plate 1 | 630 | 60 | Nitrogen |
| Example 13 | SiN1 | Brazing material 7 | 30 | Copper plate 1 | Copper plate 1 | 850 | 25 | Nitrogen |
| Example 14 | SiN2 | Brazing material 8 | 30 | Copper plate 1 | Copper plate 1 | 860 | 20 | Nitrogen |
| Example 15 | AlN | Brazing material 1 | 40 | Copper plate 3 | Copper plate 3 | 690 | 15 | Vacuum |
| Comparative example 1 | SiN1 | Brazing material 4 | 30 | Copper plate 1 | Copper plate 1 | 850 | 30 | Vacuum |
| Comparative example 2 | SiN2 | Brazing material 4 | 30 | Copper plate 2 | Copper plate 2 | 850 | 15 | Vacuum |
| Comparative example 3 | AlN | Brazing material 4 | 40 | Copper plate 3 | Copper plate 3 | 850 | 20 | Vacuum |

The bonded bodies according to the examples and the comparative examples were made using the processes described above. EDX analysis of arbitrary cross sections were performed for each bonded body. The Ti concentrations of each region of the thickness of the first region and the thickness of the second region were analyzed thereby.

200 μm long×thickness was set as the measurement region of the EDX analysis; and area analysis was performed. Also, average values of any three locations were used as M1 and M2. The Ti concentration was calculated in at %. In the calculation of at %, the total of the components other than O (oxygen), N (nitrogen), and C (carbon) was used as 100 at %. Otherwise, the conditions were as described above. The results are shown in Table 5.

TABLE 5

| | Bonding layer | | | | |
|---|---|---|---|---|---|
| | First region | | Second region | | Ti |
| | Thickness (μm) | Ti concentration M1 (at %) | Thickness (μm) | Ti concentration M2 (at %) | M1/M2 | concentration fluctuation in second region (%) |
| Example 1 | 3 | 7.5 | 25 | 3.0 | 2.5 | ±15 |
| Example 2 | 5 | 8.7 | 29 | 2.9 | 3.0 | ±15 |
| Example 3 | 2 | 6.8 | 43 | 3.8 | 1.8 | ±15 |
| Example 4 | 2 | 5.2 | 55 | 2.6 | 2.0 | ±15 |
| Example 5 | 5 | 9.3 | 25 | 2.5 | 3.7 | ±10 |
| Example 6 | 3 | 11.0 | 38 | 2.3 | 4.8 | ±20 |
| Example 7 | 2 | 6.1 | 37 | 3.8 | 1.6 | ±15 |
| Example 8 | 2 | 3.8 | 33 | 1.8 | 2.1 | ±10 |
| Example 9 | 3 | 6.2 | 35 | 2.0 | 3.1 | ±10 |
| Example 10 | 3 | 6.4 | 37 | 2.3 | 2.8 | ±10 |
| Example 11 | 2 | 2.9 | 31 | 4.2 | 0.7 | ±15 |
| Example 12 | 2 | 6.7 | 28 | 4.8 | 1.4 | ±15 |
| Example 13 | 2 | 6.7 | 31 | 2.8 | 2.4 | ±15 |
| Example 14 | 2 | 7.8 | 34 | 2.5 | 3.1 | ±15 |
| Example 15 | 3 | 7.7 | 28 | 3.1 | 2.5 | ±15 |
| Comparative example 1 | 7 | 8.6 | 39 | 0.48 | 18 | ±10 |
| Comparative example 2 | 7 | 13.4 | 40 | 0.89 | 15 | >20 |
| Comparative example 3 | 6 | 12.2 | 38 | 0.51 | 24 | >20 |

It can be seen from the analysis results of the examples 1 to 15 shown in Table 5 that M1/M2 was within the range of not less than 0.1 and not more than 5 for the bonded bodies according to the examples. Also, in the first region, a layer was observed that included titanium as a major component in which TiN was within the range of not less than 65 mass % and not more than 100 mass %.

In the second region 6 of the bonded bodies bonded in a vacuum, the mass ratios of TiSi>TiSn and CuSn>TiSn were satisfied. On the other hand, when bonding in a nitrogen atmosphere, bonded bodies were observed that did not always satisfy such relationships.

Also, the warp amount was measured for the bonded bodies according to the examples and the comparative examples. The warp amount at the long side was measured as the warp amount of the bonded body. Bonded bodies having a warp amount at the long side that was not more than 0.1 mm are shown as good (○), and the bonded bodies greater than 0.1 mm are shown as defective (x). Each bonded body was made, and the worst numerical value among fifty bonded bodies are displayed. The results are shown in Table 6.

TABLE 6

| | Joined body warp amount |
|---|---|
| Example 1 | ○ |
| Example 2 | ○ |
| Example 3 | ○ |
| Example 4 | ○ |
| Example 5 | ○ |
| Example 6 | ○ |
| Example 7 | ○ |
| Example 8 | ○ |
| Example 9 | ○ |
| Example 10 | ○ |
| Example 11 | ○ |

TABLE 6-continued

| | Joined body warp amount |
|---|---|
| Example 12 | ○ |
| Example 13 | ○ |
| Example 14 | ○ |
| Example 15 | ○ |
| Comparative example 1 | X |
| Comparative example 2 | X |
| Comparative example 3 | X |

It can be seen from Table 6 that the warp amount was small, i.e., not more than 0.1 mm, for the bonded bodies according to the examples. The warp amount of the bonded body could be reduced even when the thickness of the copper plate was different between the front and back as in the example 7, the example 8, the example 10, and the example 12. Conversely, the warp amount was greater than 0.1 mm for the bonded bodies according to the comparative examples.

Then, circuit parts and heat dissipation plates were formed by patterning the bonded bodies by etching. Also, multi-part manufacturing of the ceramic copper circuit substrate was performed by subdividing each bonded body into four. The shapes of the circuit parts and the heat dissipation plates were respectively the same between the examples and the comparative examples. Twelve bonded bodies after subdividing were prepared.

The TCT characteristics were examined for the ceramic copper circuit substrates.

In the TCT test, one cycle was −40° C.×30 minutes→room temperature×10 minutes→170° C.×30 minutes→room temperature×10 minutes. Tests of 2000 cycles and 3000 cycles were performed for the bonded bodies that used silicon nitride substrates. Also, tests of 300 cycles and 600 cycles were performed for the bonded bodies that used aluminum nitride substrates.

The bonded bodies in which no discrepancies occurred in the twelve bonded bodies were indicated as best (⊚); the bonded bodies in which one discrepancy occurred were indicated as good (○); and the bonded bodies in which two or more discrepancies occurred were indicated as no-good (×). The results are shown in Tables 7 and 8.

TABLE 7

|  | TCT test | |
| --- | --- | --- |
|  | 2000 cycles | 3000 cycles |
| Example 1 | ⊚ | ⊚ |
| Example 2 | ⊚ | ⊚ |
| Example 3 | ⊚ | ⊚ |
| Example 4 | ⊚ | ⊚ |
| Example 5 | ⊚ | ⊚ |
| Example 6 | ⊚ | ○ |
| Example 7 | ⊚ | ⊚ |
| Example 8 | ⊚ | ⊚ |
| Example 9 | ⊚ | ⊚ |
| Example 10 | ⊚ | ⊚ |
| Example 11 | ⊚ | ⊚ |
| Example 12 | ⊚ | ⊚ |
| Example 13 | ⊚ | ○ |
| Example 14 | ⊚ | ○ |
| Comparative example 1 | ⊚ | X |
| Comparative example 2 | ⊚ | X |

TABLE 8

|  | TCT test | |
| --- | --- | --- |
|  | 300 cycles | 600 cycles |
| Example 15 | ⊚ | ○ |
| Comparative example 3 | ⊚ | X |

The TCT characteristics were good for the ceramic copper circuit substrates according to the examples. It was found that the TCT characteristics are improved by controlling the Ti concentration of the bonding layer. Also, the Ti concentration can be controlled even when the bonded body is enlarged; therefore, the reliability was good even when multi-part manufacturing was performed.

In contrast, in the comparative examples, fluctuation occurred in the TCT characteristics when the Ti concentration ratio M1/M2 of the bonding layer was outside the range of not less than 0.1 and not more than 5. It is considered that the effects of the Ti concentration fluctuation increase as the bonded body is made larger. Therefore, it was found that the comparative examples were not suited to multi-part manufacturing.

While certain embodiments of the inventions have been illustrated, these embodiments have been presented by way of example only, and are not intended to limit the scope of the inventions. These novel embodiments may be embodied in a variety of other forms; and various omissions, substitutions, modifications, etc., can be made without departing from the spirit of the inventions. These embodiments and their modifications are within the scope and spirit of the inventions and are within the scope of the inventions described in the claims and their equivalents. Also, the embodiments described above can be implemented in combination with each other.

What is claimed is:

1. A bonded body, comprising:
a ceramic substrate;
a copper plate; and
a bonding layer located on at least one surface of the ceramic substrate,
the bonding layer bonding the ceramic substrate and the copper plate,
the bonding layer including titanium,
the bonding layer including
a first region including a layer, the layer being formed at an interface of the bonding layer with the ceramic substrate, the layer including titanium as a major component, and
a second region positioned between the first region and the copper plate, wherein
a ratio M1/M2 of a titanium concentration M1 at % in the first region and a titanium concentration M2 at % in the second region being not less than 0.5 and not more than 5 when the Ti concentrations are measured by EDX respectively in measurement regions in the first and second regions, each of the measurement regions having an area of 200 μm×thickness, and
the titanium concentration M2 in the second region is within a range of not less than 0.5 at % and not more than 15 at %.

2. The bonded body according to claim 1, wherein the ratio M1/M2 is within a range of not less than 0.5 and not more than 4.

3. The bonded body according to claim 1, wherein a Ti concentration fluctuation between different measurement regions in the second region is within ±20%.

4. The bonded body according to claim 1, wherein a thickness of the first region is not more than 5 μm.

5. The bonded body according to claim 1, wherein a thickness of the copper plate is not less than 0.6 mm.

6. The bonded body according to claim 1, wherein the ceramic substrate is one selected from a silicon nitride substrate and an aluminum nitride substrate.

7. The bonded body according to claim 1, wherein the second region includes one or two selected from silver and copper.

8. The bonded body according to claim 1, wherein the second region includes one or two selected from tin and indium.

9. The bonded body according to claim 1, wherein the copper plate is located at two surfaces of the ceramic substrate.

10. A ceramic copper circuit substrate, comprising:
the bonded body according to claim 1; and
the copper plate located on at least one surface of the ceramic substrate is provided with a circuit structure.

11. The bonded body according to claim 1, wherein
a Ti concentration fluctuation between the measurement regions in the second region is within ±20%, and
a thickness of the first region is not more than 5 μm.

12. The bonded body according to claim 11, wherein
a thickness of the copper plate is not less than 0.6 mm.

13. The bonded body according to claim 12, wherein
the ceramic substrate is one selected from a silicon nitride substrate and an aluminum nitride substrate.

14. The bonded body according to claim 13, wherein
the second region includes one or two selected from silver and copper and includes one or two selected from tin and indium.

15. The bonded body according to claim 14, wherein
the copper plate is located at two surfaces of the ceramic substrate.

16. A ceramic copper circuit substrate, comprising:
the bonded body according to claim 15; wherein
the copper plate located on at least one surface of the ceramic substrate is provided with a circuit structure.

17. A semiconductor device, comprising:
the ceramic copper circuit substrate according to claim 10; and
a semiconductor element mounted on the copper plate provided with the circuit structure.

* * * * *